US007542307B2

(12) United States Patent
Liao

(10) Patent No.: US 7,542,307 B2
(45) Date of Patent: Jun. 2, 2009

(54) ELECTRICAL CONNECTOR

(75) Inventor: Fang-Jun Liao, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/888,589

(22) Filed: Aug. 1, 2007

(65) Prior Publication Data

US 2008/0030967 A1 Feb. 7, 2008

(30) Foreign Application Priority Data

Aug. 1, 2006 (CN) ........................ 2006 2 0076141

(51) Int. Cl.
*H05K 7/02* (2006.01)

(52) U.S. Cl. ........................ 361/810; 361/807; 361/804

(58) Field of Classification Search ................. 361/810, 361/807, 742, 758, 770, 804; 439/76.1
See application file for complete search history.

(56) References Cited

U.S. PATENT DOCUMENTS

| | | | | |
|---|---|---|---|---|
| 4,652,973 | A * | 3/1987 | Baker et al. | 361/739 |
| 5,542,468 | A * | 8/1996 | Lin | 165/80.3 |
| 5,850,691 | A * | 12/1998 | Bell | 29/845 |
| 6,799,978 | B2 * | 10/2004 | Ma et al. | 439/73 |
| 7,371,100 | B1 * | 5/2008 | Polnyi | 439/331 |
| 2005/0186826 | A1 * | 8/2005 | Bryant | 439/342 |

* cited by examiner

*Primary Examiner*—Hung S Bui
(74) *Attorney, Agent, or Firm*—Wei Te Chung

(57) ABSTRACT

An electrical connector (100) comprises a frame (12) having a center opening (122) thereof and a bearing surface (1211) on a top end thereof, a housing (11) engaging with the opening (122) of the frame (11) having a top surface (111) and a bottom surface (112), and defining a plurality of passageways (113), a plurality of terminals (114) received in the passageways (113) of the housing (11), wherein in assembly, the housing (11) is interfering engaging with inner sides of the opening (122) with the top surface (111) higher than the bearing surface (1211).

1 Claim, 3 Drawing Sheets

ELECTRICAL CONNECTOR

BACKGROUND OF THE INVENTION

1. Field of the Invention

The present invention relates to an electrical connector for electrically connecting an electronic package with a printed circuit board.

2. Description of Prior Art

Electrical connectors are widely used in personal computer (PC) systems to electrically connect chip modules with printed circuit boards (PCBs). With development of the operating speed of the chip module upgrading, the dimension of the chip module becomes greater and greater than ever. The chip module is usually connected with the electrical connector with following modes: using pins connection mode, using solder ball connecting mode or blade conduct pad and so on. However in these modes, the conduct medium should be arranged in array mode, with the dimension of the chip module increasing, the area of the arrays also becomes greater. So with the increasing of the conduct medium, the deformation of the chip module becomes greater than ever, usually in direction towards the lateral sides of the chip module disposed with conduct medium.

A conventional connector 1 shown in FIG. 4 comprises a planar plate, a number of positioning members extending from the bottom plate of the plate, and a number of terminals received in the passageways of the housing.

with creasing of the chip module, the corresponding electrical connector becomes greater and the area of the plate becomes greater also. However, the plate is usually mode of insulate materials. So when the planar structure of the plate is made, the plate is prone to be deformed and wrecked which results in the terminals arranging and bad products incurred.

A new electrical connector that overcomes the above-mentioned problems is desired.

SUMMARY OF THE INVENTION

An object of the present invention is to provide an electrical connector able to prevent the housing from deformation.

In order to achieve the above object, an electrical connector in accordance with a preferred embodiment of the present invention comprises a housing receiving a plurality of terminals attached on a PCB, a frame surrounded the housing, and a number positioning members disposed on corners of the frame for locating the position of the chip module.

The positioning members defined on corners of the frame can locate the chip module on the frame not the housing and, the positioning members and frame can be molded separately which can decrease the deformation of the frame, when the frame is formed.

Other objects, advantages and novel features of the present invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
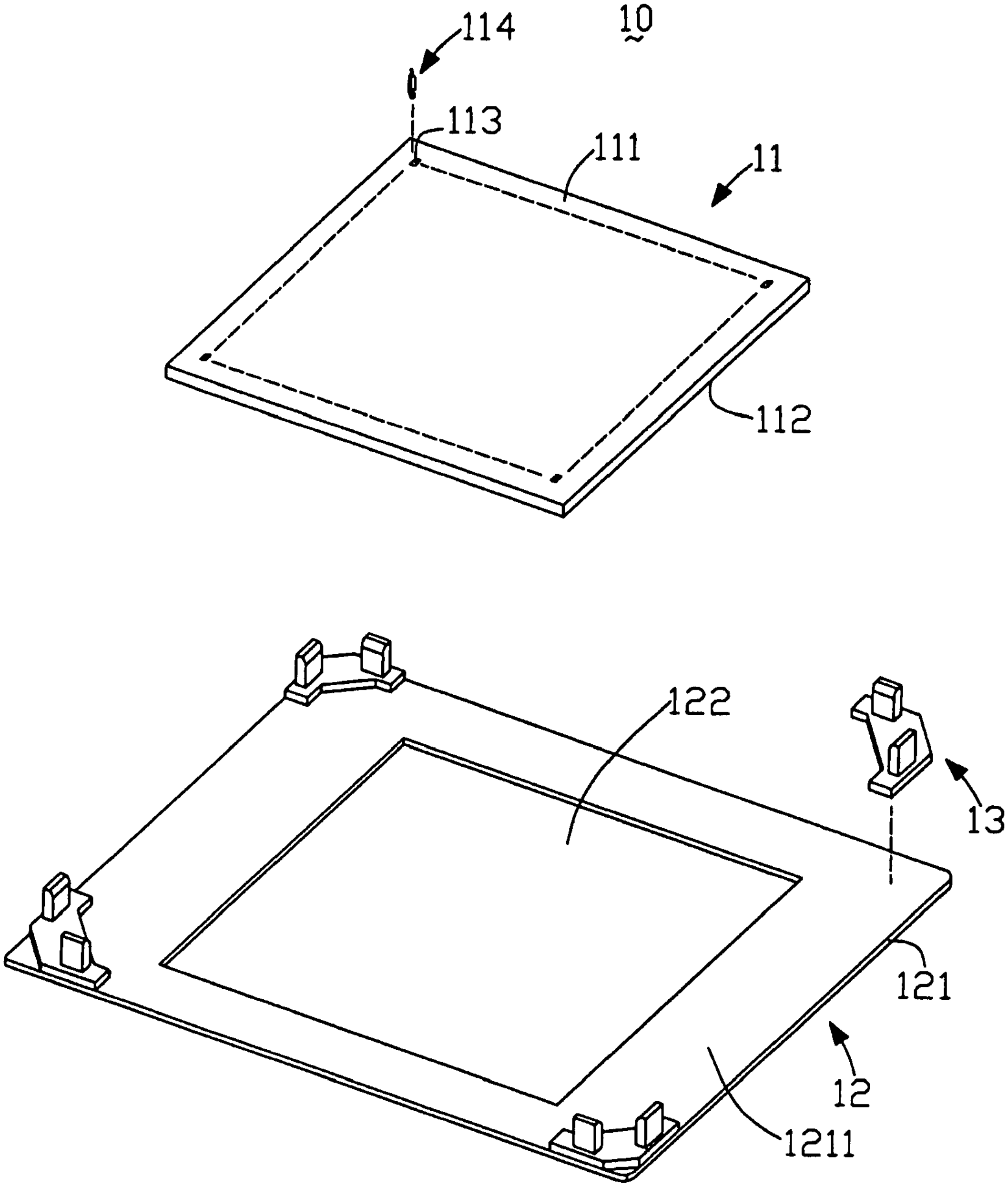
FIG. 1 is a simplified exploded, isometric view of an electrical connector in correspond to a preferred embodiment of the invention.
Figure 2:
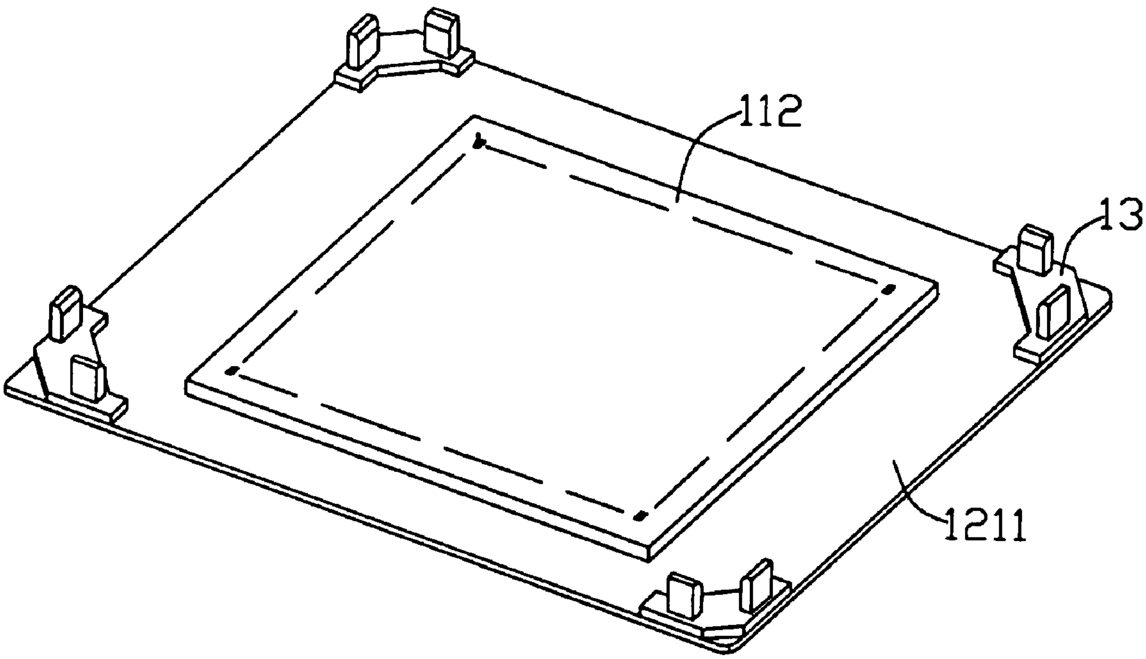
FIG. 2 is an assembled view of the electrical connector shown in FIG. 1.
Figure 3:
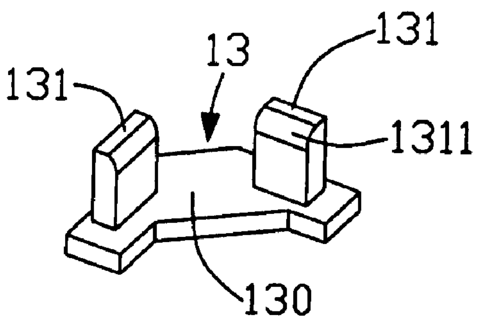
FIG. 3 is an enlarged view of the positioning members of the electrical connector shown in FIG. 1.
Figure 4:
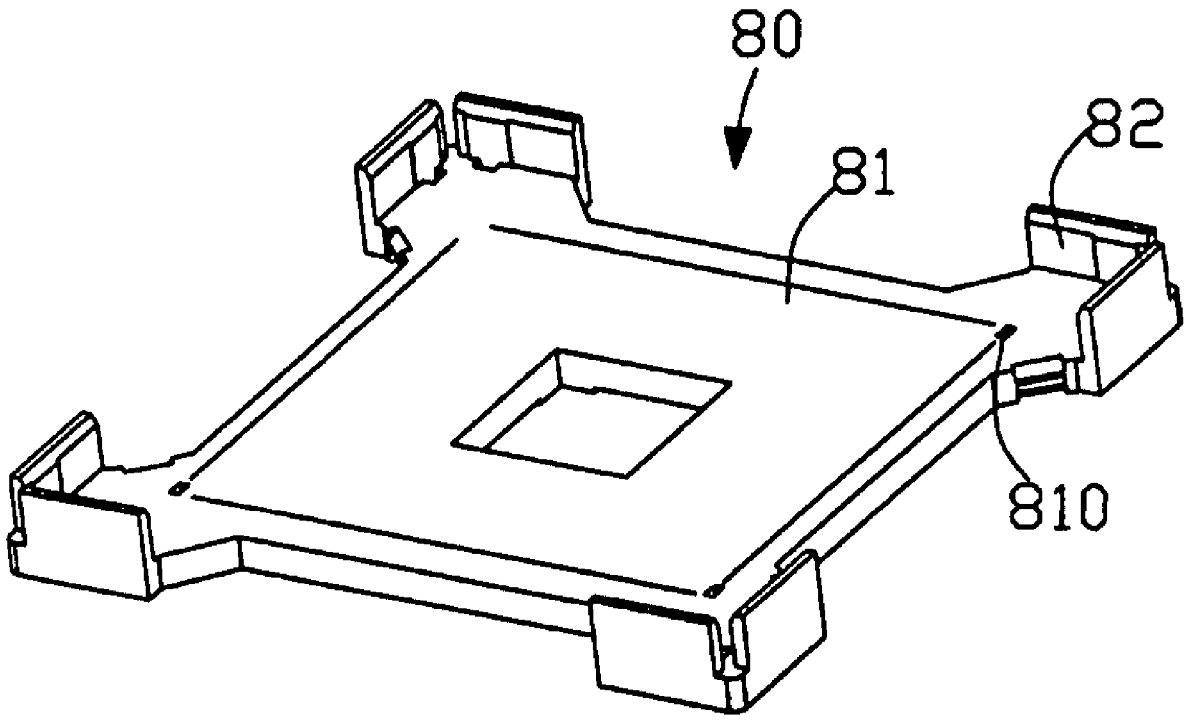
FIG. 4 is a simplified, exploded isometric view of a related electrical connector.

Referring to FIGS. 1-2, an electrical connector 10 in accordance with the preferred embodiment of the present invention is adapted for electrically connecting an electronic package such as a chip module with a circuit substrate such as a printed circuit board (PCB). The electrical connector 10 comprises a housing 11 mounted on the PCB, a plurality of terminals 114 received in the housing 11, a frame 12 surrounded the housing 11, and a number of positioning members 13 disposed on the frame 12.

The housing 11 is configured into planar body and comprises a top surface 111 and a bottom surface 112 opposite to the top surface 111 and a number of passageways 113 extending through the top surface 111 and the bottom surface 112 for receiving terminals 113 therein.

The frame 12 is also disposed into planar structure and comprises lateral sides 121 and an opening 122 surrounded by the lateral sides 121, a continued planar bearing surface 1211 formed between the opening 122 and the laterals sides 121 for bearing the positioning members 13 thereon.

When the housing 11, the frame 12 and the positioning members 13 are assembled, the housing 11 is located into the opening 122 of the frame 12, and engaging with the frame 12 by interfering fit between the inner lateral sides of the opening 122 and the outer lateral sides of the housing 11. After being assembled, the bearing surface 1211 of the frame 11 is lower than the top surface 111 of the housing 11 which can provide following merits: with the of the process speed of the chip module increasing, the dimension of the chip module become grater correspondingly than ever. Usually, lateral sides of the chip module is bended downwardly towards the housing 11 direction, so when the chip module is connected to the electrical connector 10, the laterals sides of the chip module is firstly contacted with the top surface 111 of the housing 11 which leads to the center portion of the chip module is not easy to contact with the terminals whereby the electrical connection between the chip module and the electrical printed board breaks. However, when the bearing surface 1211 is disposed lower than the top surface of the housing 11, the lateral sides of the chip module can keep away from the top surface 111 of the housing 11 and the lateral sides of the chip module is located on the lateral sides of the frame which prevent the chip module from contacting with the top surface 111.

The positioning member 13 is separated disposed with the frame 13 and comprises a base 130 attached on the bearing surface 1211 of the frame 12, a pair of stopper members 131 extending from the base 130 arranged into orthogonal form for receiving the adjacent lateral sides of the chip module wherein each stopper member 131 defines a leading surface 1311 for leading the chip module to mounted on the frame 12. In the embodiment, the positioning member 13 is disposed on the frame separated with the housing 11, so the housing 11 and frame 12 can be molded separately which can provide a preferred area of the housing 11 and the frame 12 and ensure a molding precision therebetween.

It is to be understood that the frame 12 can be made of metal material or other materials. The positioning members 13 are disposed separated with the frame 12 in the embodiment, in other embodiments; the positioning members 13 can be commonly molded with the frame 12. In addition, when the positioning members are disposed separated with the frame, which can be assembled by glue, soldered or interfering fit and so on.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting a chip module to a printed circuit board comprising:

a frame with a center opening thereof and having four corners, the frame also having a bearing surface;

a housing mounted within the center opening of the frame and having a top surface and a bottom surface, and defining a plurality of passageways extending between the top and bottom surfaces;

a plurality of terminals received in the passageways of the housing; and each of the corners assembled with a positioning member and jointly defining an area with the top surface of the housing and the positioning members being distant to the housing; wherein the positioning member comprises a base mounted on the bearing surface and a number of stopper members.

* * * * *